United States Patent
Park et al.

(10) Patent No.: US 8,178,948 B2
(45) Date of Patent: May 15, 2012

(54) ELECTROSTATIC DISCHARGE PROTECTION CIRCUIT

(75) Inventors: Jae-Young Park, Suyeong-gu (KR); Jong-Kyu Song, Gangseo-gu (KR); San-Hong Kim, Bucheonsi (KR)

(73) Assignee: Dongbu HiTek Co., Ltd., Seoul (KR)

( * ) Notice: Subject to any disclaimer, the term of this patent is extended or adjusted under 35 U.S.C. 154(b) by 490 days.

(21) Appl. No.: 12/536,378

(22) Filed: Aug. 5, 2009

(65) Prior Publication Data
US 2010/0044834 A1 Feb. 25, 2010

(30) Foreign Application Priority Data
Aug. 20, 2008 (KR) .................. 10-2008-0081275

(51) Int. Cl.
*H01L 27/06* (2006.01)
*H01L 21/8222* (2006.01)
(52) U.S. Cl. ......... 257/572; 257/E27.019; 257/E21.608; 438/330; 361/56
(58) Field of Classification Search ............ 257/572, 257/E27.019, E21.608; 438/33; 361/56
See application file for complete search history.

(56) References Cited

U.S. PATENT DOCUMENTS
2006/0044719 A1 * 3/2006 Chen et al. ............... 361/56
* cited by examiner

*Primary Examiner* — Benjamin Sandvik
*Assistant Examiner* — Whitney T Moore
(74) *Attorney, Agent, or Firm* — Sherr & Vaughn, PLLC

(57) ABSTRACT

An electrostatic discharge (ESD) protection circuit includes a substrate, and a plurality of unit bipolar transistors formed in the substrate. Each of the plurality of unit bipolar transistors may include a first-conductivity-type buried layer formed in the substrate, a first-conductivity-type well formed over the first-conductivity-type buried layer, a second-conductivity-type well formed in the first-conductivity-type well, a first-conductivity-type vertical doping layer vertically formed from the surface of the substrate to the first-conductivity-type buried layer so as to surround the first-conductivity-type well, and a first-conductivity-type doping layer and a second conductivity-type doping layer formed in the second-conductivity-type well. The first-conductivity-type doping layer of any one of the adjacent unit bipolar transistors and the first-conductivity-type vertical doping layer of another one of the adjacent unit bipolar transistors may be connected to each other.

20 Claims, 5 Drawing Sheets

FIG. 5

|  | HIGH-VOLTAGE DIODE | STACKED BIPOLAR |
|---|---|---|
| SUSTAINING VOLTAGE [V] | — | 69.0 |
| CURRENT AMOUNT PER UNIT AREA (nA/$\mu$m$^2$) | 37 | 314 |
| HBM level 1[KV] | 2 | 12 |
| IMPROVEMENT RATIO (%) | 100 | 800 |

ELECTROSTATIC DISCHARGE PROTECTION CIRCUIT

The present application claims priority under 35 U.S.C. 119 to Korean Patent Application No. 10-2008-0081275 (filed on Aug. 20, 2008), which is hereby incorporated by reference in its entirety.

BACKGROUND

To protect an integrated circuit (IC) from static electricity, an electrostatic discharge (ESD) protection circuit may be used. A high-voltage IC which uses a high driving voltage and operates in an environment sensitive to static electricity requires a higher level of ESD protection than that of a general logic IC.

FIG. 1A shows the configuration of an ESD protection circuit using a general Laterally Diffused Metal Oxide Semiconductor (LDMOS) device. Referring to FIG. 1A, an ESD circuit 110 and an internal circuit 120 are connected in parallel between a first pad 105, to which a driving voltage $V_{DD}$ is applied from an external device, and a second pad 107, to which a ground voltage $V_{SS}$ is applied. The ESD circuit 110 is a grounded-gate LDMOS device.

FIG. 1B shows a current-voltage curve of the grounded-gate LDMOS 110 shown in FIG. 1A. The current-voltage curve $S_1$ represents characteristics when static electricity is applied to the first pad 105 or the second pad 107. Referring to FIG. 1B, noise or glitches due to static electricity are introduced from an external device into the first pad 105. Therefore, when the grounded-gate LDMOS 110 is operated, a latch-up phenomenon, wherein the grounded-gate LDMOS 110 is not turned off even when the static electricity is no longer present, is generated.

This is because the sustaining voltage or the snapback voltage Vsp of the grounded-gate LDMOS 110 is lower than the driving voltage $V_{DD}$ of the internal circuit 120, as shown in FIG. 1B. Due to the latch-up phenomenon, the grounded-gate LDMOS 110 breaks down. As a result, this may lead to breakdown of the internal circuit 120.

A high-voltage diode may be used as the ESD protection circuit. The high-voltage diode does not generate the above-described latch-up phenomenon, but occupies a large area. Thus, the high-voltage diode is not suitable for an IC.

SUMMARY

Embodiments relate to a semiconductor device, and more particularly, to an electrostatic discharge (ESD) protection circuit for protecting a semiconductor device from static electricity. Embodiments relate to an ESD protection circuit which is capable of being implemented even in a small area without generating a latch-up phenomenon.

Embodiments relate to an electrostatic discharge (ESD) protection circuit which includes a substrate, and a plurality of unit bipolar transistors formed in the substrate. Each of the plurality of unit bipolar transistors includes a first-conductivity-type buried layer formed in the substrate, a first-conductivity-type well formed over the first-conductivity-type buried layer, a second-conductivity-type well formed in the first-conductivity-type well, a first-conductivity-type vertical doping layer vertically formed from the surface of the substrate to the first-conductivity-type buried layer so as to surround the first-conductivity-type well, and a first-conductivity-type doping layer and a second conductivity-type doping layer formed in the second-conductivity-type well. The first-conductivity-type doping layer of any one of the adjacent unit bipolar transistors and the first-conductivity-type vertical doping layer of another one of the adjacent unit bipolar transistors are connected to each other.

Embodiments relate to a method for forming an electrostatic discharge protection circuit which includes forming a substrate, and forming a plurality of unit bipolar transistors in the substrate. The forming of each of the plurality of unit bipolar transistors includes forming a first-conductivity-type buried layer in the substrate, forming a first-conductivity-type well over the first-conductivity-type buried layer, forming a second-conductivity-type well in the first-conductivity-type well, forming a first-conductivity-type vertical doping layer vertically from the surface of the substrate to the first-conductivity-type buried layer so as to surround the first-conductivity-type well, and forming a first-conductivity-type doping layer and a second conductivity-type doping layer in the second-conductivity-type well. The first-conductivity-type doping layer of any one of the adjacent unit bipolar transistors and the first-conductivity-type vertical doping layer of another one of the adjacent unit bipolar transistors are formed to be connected to each other.

According to the ESD protection circuit according to embodiments, it is possible to prevent a latch-up phenomenon by setting the sustaining voltage to be larger than the driving voltage, and improve area efficiency by increasing current amount per unit area.

DRAWINGS

Figure 1A:
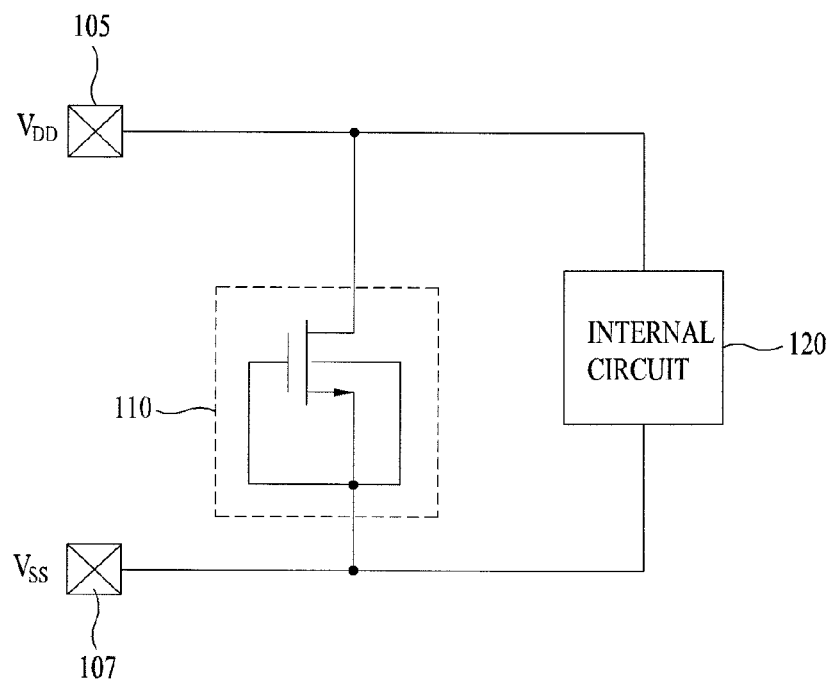
FIG. 1A is a circuit diagram of an electrostatic discharge (ESD) protection circuit using a related Laterally Diffused Metal Oxide Semiconductor (LDMOS) device.
Figure 1B:
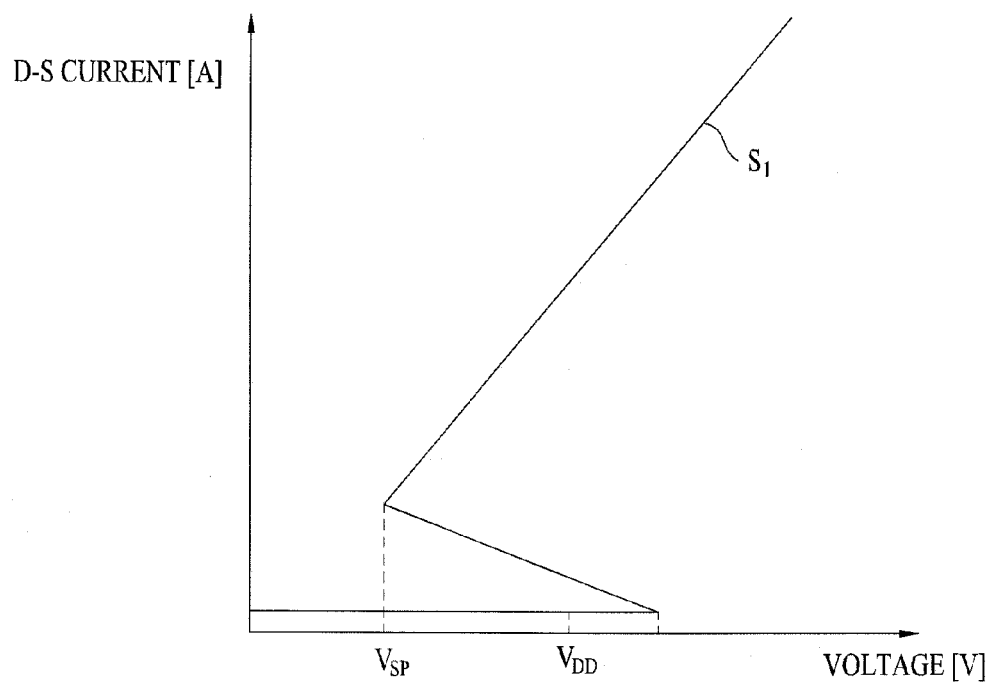
FIG. 1B shows a current-voltage curve of the grounded-gate LDMOS shown in FIG. 1A.
Figure 2:
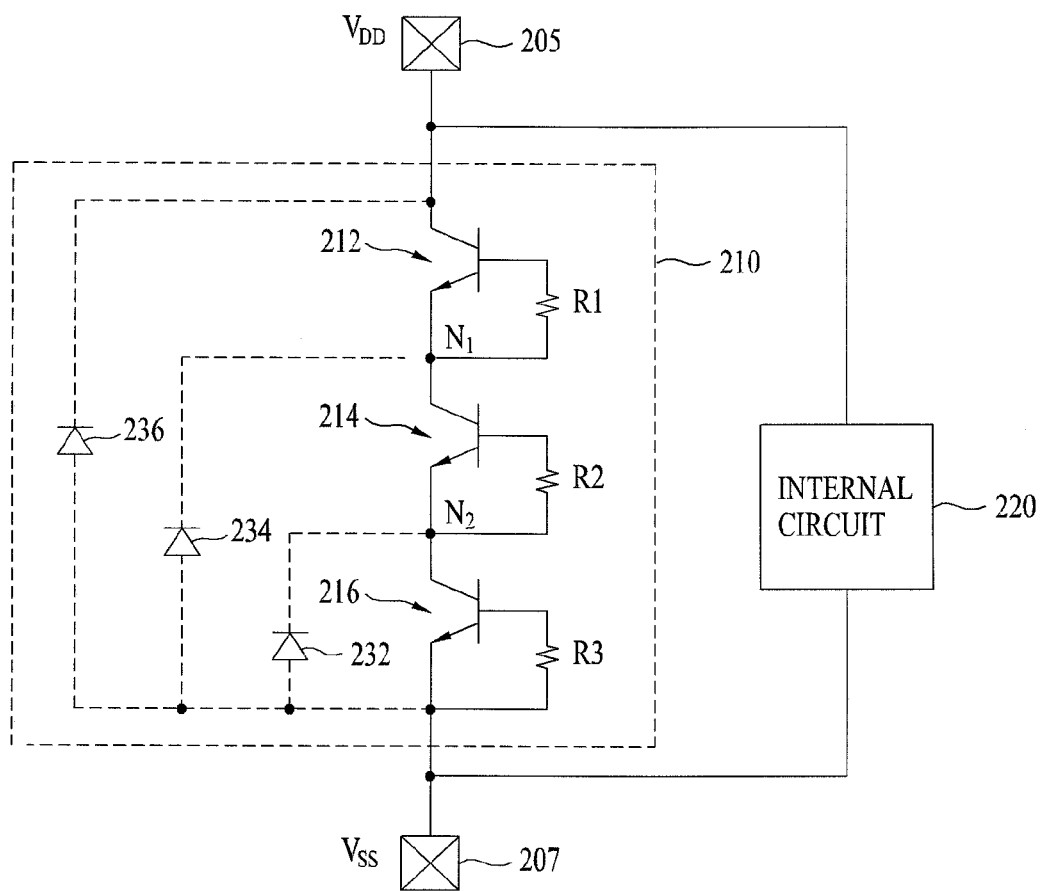

Example FIG. 2 is a circuit diagram of an ESD protection circuit according to embodiments.

Figure 3:
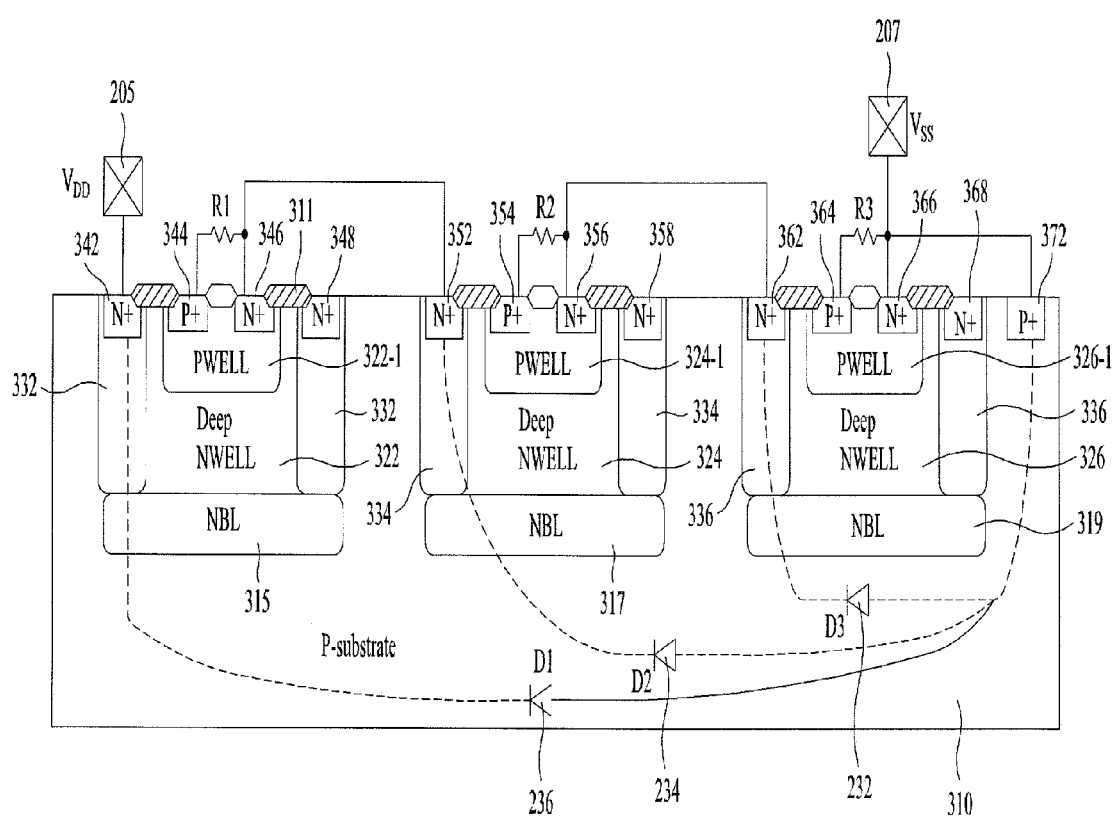

Example FIG. 3 is a cross-sectional view of the ESD protection circuit shown in example FIG. 2.

Figure 4A:
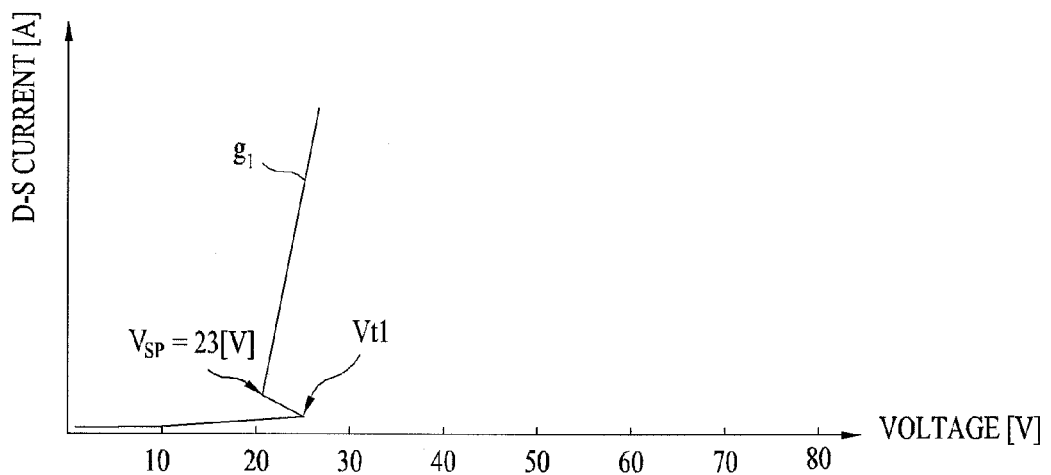

Example FIG. 4A is a graph showing the current-voltage characteristics of a unit bipolar transistor shown in example FIG. 3 upon the introduction of static electricity.

Figure 4B:
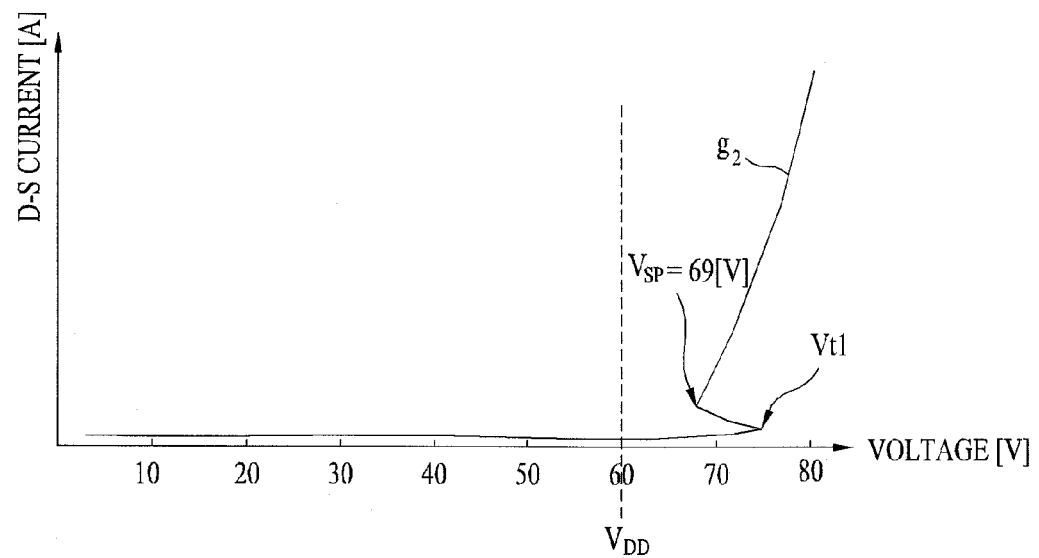

Example FIG. 4B is a graph showing the current-voltage characteristics of the ESD protection circuit shown in example FIG. 3 upon the introduction of static electricity.

Example FIG. 5 is a table for comparison of the performance of an ESD protection circuit using a high-voltage diode and the performance of the ESD protection circuit shown in example FIG. 3.

DESCRIPTION

Example FIG. 2 is a circuit diagram of an electrostatic discharge (ESD) protection circuit 210 according to embodiments. Referring to example FIG. 2, the ESD protection circuit 210 and an internal circuit 220 may be connected in parallel between a first pad 205, to which a driving voltage $V_{DD}$ is applied from an external device, and a second pad 207, to which a ground voltage $V_{SS}$ is applied. The ESD protection circuit 210 serves to protect the internal circuit 220 from static electricity introduced through the first pad 205.

That is, the ESD protection circuit 210 operates only when static electricity is introduced thorough the first pad 205. The ESD protection circuit 210 is turned off in a normal state in which static electricity is not introduced, and is turned on by impact ionization due to static electricity when static electricity is introduced. The ESD protection circuit 210 serves to pass the introduced electrostatic current to the second pad 207 so as to prevent the internal circuit 220 from being damaged due to electrostatic current.

The ESD circuit 210 may include a plurality of unit bipolar transistors (e.g., 212, 214 and 216) and a plurality of resistors R1, R2 and R3. The plurality of unit bipolar transistors 212, 214 and 216 may be connected in series between the first pad 205 and the second pad 207. For example, as shown in example FIG. 2, three bipolar transistors 212, 214 and 216 may be connected in series between the first pad 205 and the second pad 207.

That is, the collector of the first bipolar transistor 212 may be connected to the first pad 205, and the emitter of the first bipolar transistor 212 is connected to a first node N1. The first resistor R1 may be connected between the base of the first bipolar transistor 212 and the first node N1. The collector of the second bipolar transistor 214 may be connected to the first node N1 and the emitter of the second bipolar transistor 214 may be connected to a second node N2. The second resistor R2 may be connected between the base of the second bipolar transistor 214 and the second node N2. Similarly, the collector of the third bipolar transistor 216 may be connected to the second node N2. The emitter of the third bipolar transistor 216 may be connected to the second pad 207. The third resistor R3 may be connected between the base of the third bipolar transistor 216 and the second pad 207.

A method for forming an electrostatic discharge protection circuit includes forming a substrate 310, and forming a plurality of unit bipolar transistors 212, 214 and 216 in the substrate 310. The forming of each of the plurality of unit bipolar transistors 212, 214 and 216 includes forming a first-conductivity-type buried layer (315, 317, 319) in the substrate, forming a first-conductivity-type well (322, 324, 326) over the first-conductivity-type buried layer (315, 317, 319), forming a second-conductivity-type well (322-1, 324-1, 326-1) in the first-conductivity-type well (322, 324, 326), forming a first-conductivity-type vertical doping layer (332, 334, 336) vertically from the surface of the substrate 310 to the first-conductivity-type buried layer (315, 317, 319) so as to surround the first-conductivity-type well (322, 324, 326), and forming a first-conductivity-type doping layer (344, 354, 364) and a second conductivity-type doping layer (346, 356, 366) in the second-conductivity-type well. The first-conductivity-type doping layer (344, 354, 364) of any one of the adjacent unit bipolar transistors and the first-conductivity-type vertical doping layer (332, 334, 336) of another one of the adjacent unit bipolar transistors are formed to be connected to each other.

Each of the plurality of unit bipolar transistors 212, 214 and 216 may be implemented by an NPN-type bipolar transistor. Hereinafter, the detailed structure of each of the unit bipolar transistors will be described.

Example FIG. 3 is a cross-sectional view of the ESD protection circuit 210 shown in example FIG. 2. For convenience of description, the first pad 205, the second pad 207, the resistors R1, R2 and R3, and wires are denoted by symbols.

Referring to example FIGS. 2 and 3, the ESD protection circuit 210 may include a semiconductor substrate 310, the plurality of unit bipolar transistors 212, 214 and 216 formed in the semiconductor substrate 310, the plurality of resistors R1, R2 and R3 and a second-conductivity-type guard ring 372. A device isolation film 311 defining a device isolation region and an active region may be formed in the semiconductor substrate 310.

The plurality of unit bipolar transistors 212, 214 and 216 includes first-conductivity-type buried layers 315, 317 and 319, first-conductivity-type deep wells 322, 324 and 326, second-conductivity-type P-wells 322-1, 324-1 and 326-1, first-conductivity-type vertical doping layers 332, 334 and 336, second-conductivity-type doping layers 344, 354 and 364 and first-conductivity-type doping layers 346, 356 and 366, respectively.

For example, the first bipolar transistor 212 includes the N-type buried layer 315, the N-type deep well 322, the P-type well 322-1, the N-type vertical doping layer 332, the P-type doping layer 344 and the N-type doping layer 346.

The first-conductivity-type buried layer (e.g., 315) may be formed by selectively doping impurity ions (e.g., N-type impurity ions) into the semiconductor substrate 310. The first-conductivity-type deep well (e.g., 322) may be formed adjacent to the upper side of the first-conductivity-type buried layer (e.g., 315).

The second-conductivity-type well (e.g., 322-1) may be formed in the upper surface of the first-conductivity-type deep well (e.g., 322). The second-conductivity-type doping layer 344 and the first-conductivity-type doping layer 346 may be formed in the second-conductivity-type well (e.g., 322-1) so as to be isolated from each other.

The first-conductive-layer vertical doping layer (e.g., 332) may be vertically formed from the surface of the semiconductor substrate 310 to the first-conductivity-type buried layer (e.g., 315) so as to surround the first-conductivity-type deep well (e.g., 322). Therefore, since the first-conductivity-type deep well (e.g., 322) is surrounded by the first-conductivity-type buried layer (e.g., 315) and the first-conductivity-type vertical doping layer (e.g., 332), the first-conductivity-type deep well (e.g., 322) may be isolated from the semiconductor substrate (e.g., the P-type substrate 310) by the first-conductivity-type vertical doping layer (e.g., 332).

The electrons and holes in the first-conductivity-type deep well (e.g., 322) are not discharged to the semiconductor substrate 310. This is because the vertical doping layer (e.g., 332) and the first-conductivity-type buried layer (e.g., 315) surrounding the first-conductivity-type (e.g., N-type) deep well (e.g., 322) are reverse biased with respect to the semiconductor substrate (e.g., P-type substrate), by applying the high voltage (e.g., $V_{DD}$) thereto. As a result, the plurality of unit bipolar transistors 212, 214 and 216 may be isolated from the semiconductor substrate 310, and the plurality of unit bipolar transistors 212, 214 and 216 may be isolated from each other.

The second-conductivity-type doping layer 344 and the first-conductive doping layer 346 may be formed in the second-conductivity-type well (e.g., 322-1) so as to be isolated from each other. The second-conductivity-type doping layer 344 becomes the second-conductivity-type base of the bipolar transistor 212, and the first-conductivity-type doping layer 346 becomes the first-conductivity-type emitter of the bipolar transistor 212. In addition, the first-conductivity-type vertical doping layer (e.g., 332) becomes the first-conductivity-type collector of the bipolar transistor 212. The first-conductivity-type doping layer (e.g., 346), the second-conductivity-type doping layer (e.g., 344) and the first-conductivity-type doping layer (e.g., 332) may form the NPN-type bipolar transistor.

Any one of the plurality of resistors R1, R2 and R3 may be connected between the first-conductivity-type doping layer and the second-conductivity-type doping layer of each of the plurality of unit bipolar transistors. For example, the first resistor R1 of the plurality of resistors R1, R2 and R3 is connected between the second-conductivity-type base 344 and the first-conductive-emitter 346 of the first bipolar transistor.

The first-conductivity-type doping layer of any one of the unit bipolar transistors and the first-conductivity-type vertical doping layer of another unit bipolar transistor may be connected to each other. For example, the first-conductivity-type doping layer 346 of the first bipolar transistor 212 and the first-conductivity-type vertical doping layer 352 of the second bipolar transistor 214 may be connected to each other. The first-conductivity-type doping layer 356 of the second bipolar transistor 214 may be connected to the first-conductivity-type vertical doping layer 362 of the third bipolar transistor 216.

The first-conductivity-type vertical doping layer of any one of the plurality of unit bipolar transistors (e.g., 212, 214 and 216) may be connected to the first pad 205. The first-conductivity-type doping layer of another one of the plurality of unit bipolar transistors (e.g., 212, 214 and 216) may be connected to the second pad 207.

For example, the first-conductivity-type vertical doping layer 342 of the first bipolar transistor 212 may be connected to the first pad 205, and the first-conductivity-type doping layer 366 of the third bipolar transistor 214 may be connected to the second pad 207. The second-conductivity-type guard ring 372 may be connected to the second pad 207.

The high-concentration first-conductivity-type impurities may be doped into the upper sides of the first-conductivity-type vertical doping layers (e.g., 332, 334 and 336) of the plurality of unit bipolar transistors (e.g., 212, 214 and 216), for ohmic contact. For example, the first-conductivity-type impurities having higher concentration than that of impurities implanted when forming the first-conductivity-type vertical doping layer may be doped into the upper sides of the first-conductivity-type vertical doping layers (e.g., 332, 334 and 336), for ohmic contact. Similarly, the second-conductivity-type impurities, that are present at a higher concentration than the impurities of the semiconductor substrate (e.g., P-type substrate), may be doped into the second-conductivity-type guard ring 372, for ohmic contact.

Example FIG. 4A is a graph G1 showing the current-voltage characteristics of the unit bipolar transistor 212 shown in example FIG. 3 upon the introduction of static electricity. The current refers to the collector-emitter current of the unit bipolar transistor 212 and the voltage refers to the collector-emitter voltage.

As shown in the graph g1 of example FIG. 4A, since the bipolar transistor used in the ESD protection circuit uses a snapback region but does not have a Double Diffused Drain (DDD) structure like a Laterally Diffused Metal Oxide Semiconductor (LDMOS) device, a snapback phenomenon is not generated and the sustaining voltage of the bipolar transistor is relatively higher than that of the LDMOS device. When static electricity is introduced into the first pad 205, the sustaining voltage Vsp of the unit bipolar transistor (e.g., 212) manufactured in a 0.35-mm 60-V Bipolar CMOS-DMOS (BCD) process is 23 V, which is at least twice the sustaining voltage, 10 V or less, of the LDMOS device. Since the sustaining voltage of the unit bipolar transistor is lower than the operation voltage, 60 V, of the internal circuit, the ESD protection circuit 210 according to embodiments has a structure in which the plurality of unit bipolar transistors are connected, for example, a structure in which three unit bipolar transistors shown in example FIG. 3 are connected in series, in order to eliminate the snapback phenomenon.

Example FIG. 4B is a graph G2 showing the current-voltage characteristics of the ESD protection circuit 210 shown in example FIG. 3 upon the introduction of static electricity. For example, in order to operate the internal circuit 220 shown in example FIG. 2, the driving voltage VDD applied to the first pad 205 is 60 V. An initial maximum voltage is referred to as a triggering voltage Vt1 and an initial minimum voltage which appears after the triggering voltage Vt1 is referred to as a sustaining voltage Vsp. A region between the triggering voltage Vt1 and the sustaining voltage Vsp is referred to as a snapback region.

As shown in the graph of example FIG. 4B, the sustaining voltage Vsp of the ESD protection circuit 210 is 69 V. The sustaining voltage Vsp of the ESD protection circuit is three times the sustaining voltage (23 V) of the unit bipolar transistor shown in example FIG. 4A.

As shown in example FIG. 3, the first-conductivity-type deep well (e.g., 322) of each of the unit bipolar transistors 212, 214 and 216 is isolated from the semiconductor substrate (e.g., P-type substrate) by the first-conductivity-type buried layer (e.g., 315) and the first-conductivity-type vertical doping layer (e.g., 332).

The sustaining voltage Vsp of the ESD protection circuit 210 in which the three unit bipolar transistors 212, 214 and 216 having the structure shown in example FIG. 3 are connected in series is equal to a value (Vsp=69 V) obtained by summing the sustaining voltages (23 V) of the unit bipolar transistors 212, 214 and 216. Accordingly, the ESD protection circuit having the sustaining voltage (e.g., Vsp=69 V) higher than the driving voltage (VDD=60 V) may be configured by connecting the unit bipolar transistors 212, 214 and 216 having the structure shown in example FIG. 3.

If the unit bipolar transistors 212, 214 and 216 share the P-type semiconductor substrate 310 without isolation, it is impossible to obtain a sustaining voltage higher than the driving voltage. This is because the unit bipolar transistors are not sequentially triggered but are simultaneously triggered by the current of the substrate. Accordingly, the bipolar transistors 212, 214 and 216 need to be isolated by the first-conductivity-type buried layer 315, 317 and 319.

To protect the semiconductor device using the driving voltage VDD of 60 V, the sustaining voltage of the ESD protection circuit 210, in which the three unit bipolar transistors connected in series as shown in example FIG. 3 and having the sustaining voltage characteristics of 23 V, becomes 69 V.

Therefore, since the sustaining voltage Vsp of the ESD protection circuit 210 is greater than the driving voltage (VDD=60 V), after static electricity is introduced into the first pad 205 so as to operate the ESD protection circuit 210, a latch-up phenomenon is not generated.

The triggering voltages Vt1 of the unit bipolar transistors may be set by the resistors R1, R2 and R3 connected between the second-conductivity-type bases 344, 354 and 364 and the first-conductivity-type emitters 346, 356 and 366 of the unit bipolar transistors 212, 214 and 216. That is, the triggering voltage Vt1 of the ESD protection circuit 210 is also equal to a value obtained by summing the triggering voltages of the unit bipolar transistors 212, 214 and 216. Accordingly, the triggering voltage Vt1 of the ESD protection circuit 210 may be set by the resistors R1, R2 and R3.

For example, the triggering voltage Vt1 of the ESD protection circuit 210 may be set to be smaller than the breakdown voltage of the internal circuit 220 by the resistors R1, R2 and R3. This is because, if the triggering voltage Vt1 of the ESD protection circuit 210 is greater than the breakdown voltage of the internal circuit 220, the internal circuit may break down.

If static electricity is introduced into the second pad 207, the unit bipolar transistors 212, 214 and 216 of the ESD protection circuit 210 operate so as to have forward diode characteristics. This is because the second-conductivity-type guard ring 372 connected to the second pad 207 forms parasitic diodes D1, D2 and D3 in association with the plurality of unit bipolar transistors 212, 214 and 216.

For example, the first PN junction parasitic diode D1 may be formed between the guard ring 372 and the buried layer 315 and the first-conductivity-type vertical doping layer 332 of the first bipolar transistor 212, the second PN junction parasitic diode D2 may be formed between the guard ring 372 and the buried layer 317 and the first-conductivity-type vertical doping layer 334 of the second bipolar transistor 214, and the third PN junction parasitic diode D3 may be formed between the guard ring 372 and the buried layer 319 and the first-conductivity-type vertical doping layer 336 of the third bipolar transistor 216. The first to third PN junction parasitic diodes D1, D2 and D3 correspond to the parasitic diodes 236, 234 and 232 shown in example FIG. 2, respectively.

Accordingly, if static electricity is introduced into the second pad 207, since the first, second third PN junction diodes have the forward bias characteristics, static electricity introduced into the second pad 207 is discharged to the first pad 205 through the first, second and third PN junction diodes D1, D2 and D3 and, in particular, is mostly discharged through the first PN junction diode D1.

Example FIG. 5 is a table for comparison of the performance of an ESD protection circuit using a high-voltage diode and the performance of the ESD protection circuit shown in example FIG. 3. The ESD protection circuit using the high-voltage diode is referred to as the former circuit and the ESD protection circuit 210 shown in example FIG. 3 is denoted by "stacked bipolar" and is referred to as the latter circuit.

Referring to example FIG. 5, the sustaining voltage (VDD=10 V) of the former circuit is smaller than the driving voltage (VDD=60V), but the sustaining voltage (VDD=69V) of the latter circuit is larger than the driving voltage (VDD=60 V). In addition, the current amount per unit area (314 (nA/mm²)) of the latter circuit is significantly larger than current amount per unit area (37 (nA/mm²)) of the former circuit. In addition, in view of a Human Body Level (HBM) which is a general ESD robustness criterion, the HBM (12 kV) of the latter circuit is six times the HBM (2 kV) of the former circuit. In addition, the latter circuit is better than the former circuit in terms of area.

According to the ESD protection circuit having the structure shown in example FIG. 3, it is possible to prevent the latch-up phenomenon by setting the sustaining voltage to be larger than the driving voltage and improve area efficiency by increasing the current amount per unit area.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a substrate; and
   a plurality of unit bipolar transistors formed in the substrate,
   wherein each of the plurality of unit bipolar transistors includes:
      a first-conductivity-type buried layer formed in the substrate;
      a first-conductivity-type well formed over the first-conductivity-type buried layer;
      a second-conductivity-type well formed in the first-conductivity-type well;
      a first-conductivity-type vertical doping layer vertically formed from the surface of the substrate to the first-conductivity-type buried layer so as to surround the first-conductivity-type well; and
      a first-conductivity-type doping layer and a second-conductivity-type doping layer formed in the second-conductivity-type well, and
      wherein the first-conductivity-type doping layer of any one of the adjacent unit bipolar transistors and the first-conductivity-type vertical doping layer of another one of the adjacent unit bipolar transistors are connected to each other.

2. The apparatus of claim 1, including a resistor connected between the first-conductivity -type doping layer and the second-conductivity-type doping layer.

3. The apparatus of claim 2, wherein the resistors connected between the first-conductivity -type doping layers and the second-conductivity-type doping layers of the plurality of unit bipolar transistors have the same value.

4. The apparatus of claim 1, including:
   a first pad to which a first voltage is applied; and
   a second pad to which a second voltage is applied,
   wherein the first-conductivity-type vertical doping layer of any one of the plurality of unit bipolar transistors is connected to the first pad, and the first-conductivity-type doping layer of another one of the plurality of unit bipolar transistors is connected to the second pad.

5. The apparatus of claim 4, including a guard ring which is connected to the second pad and into which second-conductivity-type impurities of the substrate are doped.

6. The apparatus of claim 5, wherein, when static electricity is introduced into the second pad, a PN junction diode is formed between the guard ring and the buried layer and the first-conductivity-type vertical doping layer of each of the unit bipolar transistors, and the static electricity is discharged to the first pad through the PN junction diode.

7. The apparatus of claim 5, wherein:
   the plurality of unit bipolar transistors includes first to third unit bipolar transistors, and
   the first-conductivity-type vertical doping layer of the first unit bipolar transistor is connected to the first pad, the first-conductivity-type doping layer of the first unit bipolar transistor is connected to the first-conductivity-type vertical doping layer of the second unit bipolar transistor, and the first-conductivity-type doping layer of the third unit bipolar transistor is connected to the guard ring.

8. The apparatus of claim 7, wherein the plurality of unit bipolar transistors form an electrostatic discharge protection circuit to protect an integrated circuit on the substrate from static electricity.

9. The apparatus of claim 4, wherein the plurality of unit bipolar transistors form an electrostatic discharge protection circuit to protect an integrated circuit on the substrate from static electricity.

10. The apparatus of claim 9, wherein, when static electricity is introduced into the first pad, a sustaining voltage of the electrostatic discharge protection circuit is a voltage obtained by summing sustaining voltages of the plurality of unit bipolar transistors.

11. The apparatus of claim 1, wherein the substrate is a P-type substrate, the first conductive type is an N-type, and the second conductive type is a P-type.

12. The apparatus of claim 1, wherein the first-conductivity-type well is surrounded by the first-conductivity-type buried layer and the first-conductive type vertical doping layer so as to be isolated from the substrate.

13. The apparatus of claim 1, wherein the first-conductivity-type doping layer and the second-conductivity-type doping layer are electrically connected.

14. The apparatus of claim 1, wherein the plurality of unit bipolar transistors form an electrostatic discharge protection circuit to protect an integrated circuit on the substrate from static electricity.

15. A method comprising:
forming a substrate; and
forming a plurality of unit bipolar transistors in the substrate,
wherein forming each of the plurality of unit bipolar transistors includes:
forming a first-conductivity-type buried layer in the substrate;
forming a first-conductivity-type well over the first-conductivity-type buried layer;
forming a second-conductivity-type well in the first-conductivity-type well;
forming a first-conductivity-type vertical doping layer vertically from the surface of the substrate to the first-conductivity-type buried layer so as to surround the first-conductivity-type well; and
forming a first-conductivity-type doping layer and a second conductivity-type doping layer in the second-conductivity-type well, and
wherein the first-conductivity-type doping layer of any one of the adjacent unit bipolar transistors and the first-conductivity-type vertical doping layer of another one of the adjacent unit bipolar transistors are connected to each other.

16. The method of claim 15, including forming a resistor connected between the first-conductivity-type doping layer and the second-conductivity-type doping layer.

17. The method of claim 16, wherein the resistors connected between the first-conductivity-type doping layers and the second-conductivity-type doping layers of the plurality of unit bipolar transistors have the same value.

18. The method of claim 15, including:
forming a first pad to which a supply voltage is applied; and
forming a second pad to which a ground voltage is applied,
wherein the first-conductivity-type vertical doping layer of any one of the plurality of unit bipolar transistors is connected to the first pad, and the first-conductivity-type doping layer of another one of the plurality of unit bipolar transistors is connected to the second pad.

19. The method of claim 18, including forming a guard ring which is connected to the second pad and into which second-conductivity-type impurities of the substrate are doped.

20. The method of claim 18, wherein the plurality of unit bipolar transistors form an electrostatic discharge protection circuit to protect an integrated circuit on the substrate from static electricity.

* * * * *